United States Patent [19]
Pashley

[11] 3,946,369
[45] Mar. 23, 1976

[54] HIGH SPEED MOS RAM EMPLOYING DEPLETION LOADS

[75] Inventor: Richard D. Pashley, Mountain View, Calif.

[73] Assignee: Intel Corporation, Santa Clara, Calif.

[22] Filed: Apr. 21, 1975

[21] Appl. No.: 569,693

[52] U.S. Cl. ............................. 340/173 R; 307/238
[51] Int. Cl.² ............................................ G11C 7/06
[58] Field of Search ................ 340/173 R, 173 DR; 307/238

[56] References Cited
UNITED STATES PATENTS

| | | | |
|---|---|---|---|
| 3,848,237 | 11/1974 | Geilhufe et al. ................ | 340/173 R |
| 3,868,657 | 2/1975 | Hoffman et al. ................ | 340/173 R |
| 3,906,463 | 9/1975 | Yu ................................... | 340/173 R |

*Primary Examiner*—Stuart N. Hecker
*Attorney, Agent, or Firm*—Spensley, Horn & Lubitz

[57] ABSTRACT

An MOS static random-access memory (RAM) in which high-speed is obtained, in part, through limiting the voltage swing on column lines. Column sense amplifiers are effectively de-coupled from a common read bus limiting capacitance associated with column lines. A unique address buffer assures that each address bit is generated simultaneously with its complement, thereby preventing multiple selections.

14 Claims, 3 Drawing Figures

HIGH SPEED MOS RAM EMPLOYING DEPLETION LOADS

BACKGROUND OF THE INVENTION

1. Field of the Invention

The invention relates to the field of MOS random-access memories.

2. Prior Art

Numerous metal-oxide-silicon (MOS), random-access memories (RAMs) are known in the prior art, including memories which employ load transistors which operate in a depletion mode. These memories are typically fabricated on a single silicon substrate, and in static memories, employing bistable circuits for memory cells. A plurality of Y-lines or column lines are used both for sensing information stored in the cell (reading) and also to write information into the cells. These column lines communicate with a single read bus which in turn supplies output data through an output buffer.

To provide high speed operation, the capacitance associated with the column lines must be minimized. However, in prior art memories the capacitance of any particular column line often includes capacitance associated with the read lines, and even, capacitance associated with other column lines. This added capacitance reduces the rate at which information may be read from the cell, and hence reduces the overall access time of the memory. As will be seen, the present invention provides a column sense amplifier which de-couples the unselected column lines from the read bus, and furthermore, which permits reliable sensing of small voltage changes on the column line.

Another problem encountered in prior art memories, particularly as access time is decreased, is that of multiple selection. Often address buffers are utilized to generate the complement of an address, thus, for each address bit its complement is also used in the decoders. However, if the complement bits are delayed from the "true" address bits (because of delays in the address buffers) multiple selections can occur. As will be seen, the present invention provides an address buffer in which the complement of an address bit is generated simultaneously with the buffered true address bit.

SUMMARY OF THE INVENTION

An MOS RAM employing at least one column line which is coupled to a memory cell and which communicates with a read line is disclosed. A first MOS transistor is employed to charge the column line to a source of a first potential. A second MOS transistor which includes a first and second terminal and a gate, has its first terminal coupled to the column line and its gate coupled to a second potential, where the difference between the first and second potential is approximately equal to the threshold voltage of the second transistor. A third MOS transistor is utilized for charging the second terminal of the second transistor to the second potential. When the potential on the column line changes, the second transistor conducts changing the potential on the second terminal of the second transistor, which changed potential may be coupled to a read line.

DETAILED DESCRIPTION OF THE INVENTION

A high-speed MOS static RAM employing depletion load devices is disclosed. In its presently preferred embodiment the memory is fabricated on a p-type silicon substrate and employs n-channel devices in a 1,024 × 1 word arrangement organized in an array having 32 columns and 32 rows. The memory employs depletion load devices which are fabricated by ion implantation. All of the transistors in the memory employ polycrystalline silicon gates. By way of example, worse case access times of 300 nanoseconds have been obtained. As will be appreciated, the specific implementation of the presently preferred embodiment is not crucial to the invention disclosed herein, but nonetheless is set forth in order that the disclosed circuits may be fully appreciated.

Figure 1:
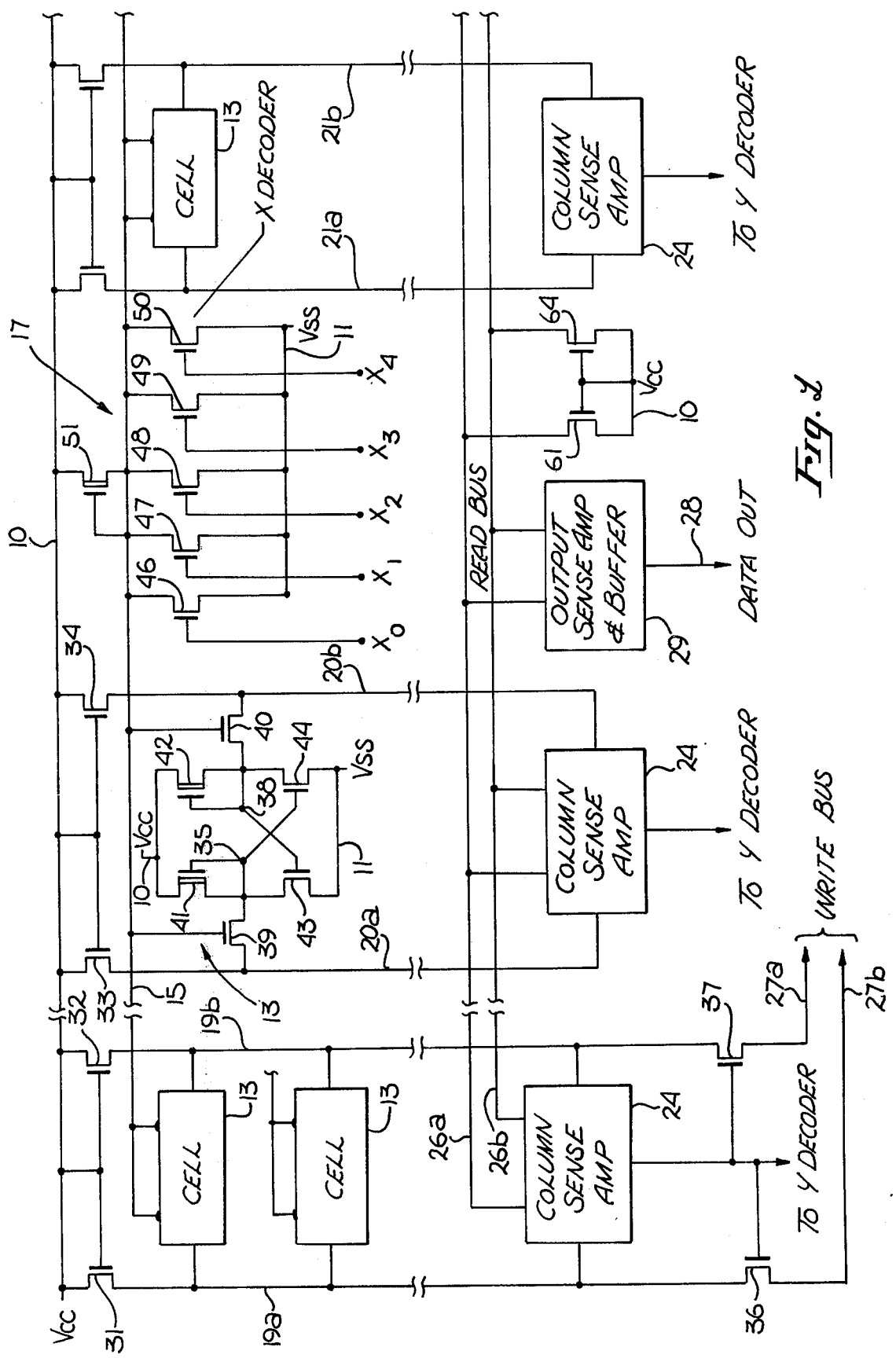
FIG. 1 is a general block diagram of the presently disclosed memory illustrating, among other things, a cell and a decoder.

Referring first to FIG. 1, the memory array is arranged with 16 columns of cells disposed to the right of the X-decoders and with 16 columns of cells disposed to the left of the X-decoders. This is illustrated partially in FIG. 1 with column lines 19a and 19b and column lines 20a and 20b disposed to the left of an X-decoder 17 and with column lines 21a and 21b disposed to the right of X-decoder 17. Each column of cells includes a pair of column lines such as lines 19a and 19b which are coupled to the cells 13, and which are also coupled to a column sense amplifier 24. Additionally, the column lines are coupled to the right bus, for example, lines 19a and 19b are coupled to the write bus 27a and 27b through transistors 36 and 37. These transistors have their gates coupled to a Y-decoder, and hence conduct when a particular column in the array has been selected. Each of the column sense amplifiers are coupled to the single read bus 26a and 26b. This read bus is coupled to the input of the output sense amplifier and buffer 29. The output of this buffer, line 28, provides the data output signal during the read cycle.

Each of the column lines in the array are coupled to line 10, the source of the $V_{CC}$ potential (+5 volts in the presently preferred embodiment) through a pair of pull-up transistors which operate as enhancement loads. Specifically, line 19a is coupled to line 10 through transistor 31 and line 19b is coupled to line 10 through transistor 32. The gates of both these transistors are also coupled to line 10. Similarly, lines 20a, 20b are coupled to line 10 through transistors 33 and 34, respectively, and the remaining column lines in the array are likewise coupled to line 10 through similar pull-up transistors.

In the presently preferred embodiment each of the memory cells 13 includes a bistable circuit coupled between, line 10 and ground identified as line 11, $V_{SS}$ in FIG. 1 and between a pair of column lines. (The term ground as used in this application need not be zero volts). Each cell includes a first branch, transistors 41 and 43 coupled in a series between lines 10 and 11, and a second branch, transistors 42 and 43, again coupled between lines 10 and 11. Transistors 41 and 42 are depletion loads with the gate of transistor 41 being coupled to node 35 and the gate of transistor 42 being coupled to node 38. Feedback between the two branches of the cell is provided from node 38 to the gate of transistor 43 and from node 35 to the gate of transistor 44. Node 35 is coupled to one of the column lines 20a through transistor 39, while node 38 is coupled to column line 20b through transistor 40. The gates of transistors 39 and 40 are coupled to an X-line in the array, line 15. The bistable cell 13 operates in a similar manner to other prior art cells.

A single X-decoder 17 is illustrated in FIG. 1 and includes decoding transistors 46 through 50 coupled between line 15 and line 11. The gates of these transistors receive a row address signal from the address buffers. The other X-decoders in the array receive the row signals (and their complements) in order that one (and only one) X-line in the array may be selected for any address. Each of the X-decoders receives power from line 10 through a depletion load device such as transistor 51. Y-decoders not illustrated which may be similar to the X-decoder 17 are utilized for decoding the Y-portion of the address.

The read bus lines 26a and 26b are coupled to a pair of pull-up transistors 61 and 64, respectively. These enhancement load transistors are used to charge the read bus lines to the $V_{CC}$ potential less a threshold.

Figure 2:
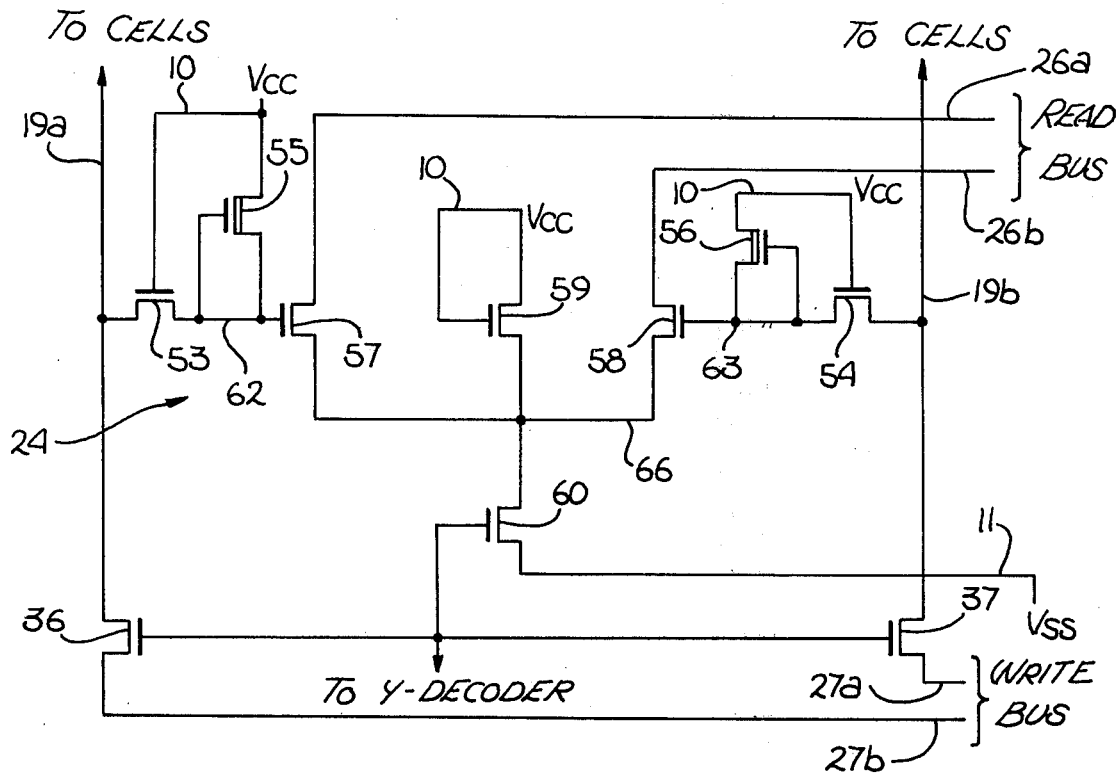
FIG. 2 is a detail circuit diagram illustrating the presently preferred embodiment of the column sense amplifier used in the present invention.

Referring now to FIG. 2, a single column sense amplifier 24 is illustrated coupled to column lines 19a and 19b, to the read bus lines 26a and 26b and to the write bus lines 27a and 27b. Line 26a is coupled to node 66 through transistor 57 while line 26b is coupled to node 66 through transistor 58. Node 66 is coupled to the $V_{CC}$ potential through an enhancement load 59 and to ground, line 11, through transistor 60. The gate of transistor 60 is coupled to a Y-decoder, and hence this transistor conducts only when the column is selected. The gate of transistor 57 is coupled to line 19a through transistor 53. Similarly, the gate of transistor 58 is coupled to line 19b through transistor 54. One terminal of the sense amplifier transfer transistor 53 (node 62) is coupled to $V_{CC}$ through a depletion load transistor 55. The gate of transistor 53 is coupled directly to line 10 ($V_{CC}$). Similarly, one terminal of the sense amplifier transfer transistor 54, node 63, is coupled to $V_{CC}$ through a depletion load transistor 56, while the gate of transistor 54 is coupled directly to $V_{CC}$. As previously mentioned, the depletion load devices are ion implanted, and in the presently preferred embodiment the entire memory is fabricated on a single substrate with all the depletion load devices being ion implanted, simultaneously.

First, the operation of the sense amplifier 24 of FIG. 2 will be examined when the column (lines 19a and 19b) has been selected, that is when a positive signal exists on the gate of transistor 60. Assume, for the sake of discussion, that a cell has been selected along column lines 19a and 19b, and the cell is programmed such that the potential on line 19a drops. Prior to the time that a cell is selected it should be noted that line 19a is charged to the potential $V_{CC}$ less the threshold of transistor 31 (FIG. 1). Moreover, node 62, since it is coupled to $V_{CC}$ through a depletion load, transistor 55, will be maintained at $V_{CC}$. Thus, the potential across the source and drain terminals of transistor 53 is precisely one threshold.

When the potential on line 19a drops (even slightly) node 62 quickly discharges through transistor 53. To assure that node 62 quickly discharges, the ratio of the channel width to length for transistor 53 is much greater than that of transistor 31 of FIG. 1. In this regard it should be noted that the depletion load transistor 55 is current limiting, and moreover, transistor 55 is a smaller device than transistor 53. In practice the potential on node 62 drops quickly to the potential of line 19a before the potential on line 19a drops more than a few tenths of a volt. In this manner the state of the selected cell is sensed before the potential on the high capacitance line 19a drops significantly. Note that the potential on node 62 drops significantly when compared to the drop of potential on line 19a. For example, node 62 may be charged to 5 volts through transistor 55 while line 19a prior to being coupled to the cell is maintained at a potential of approximately 3.5 volts due to the threshold drop of transistor 31 of FIG. 1. When line 19a drops a few tenths of a volt, transistor 53 conducts and node 62 quickly drops to the potential of line 19a.

The drop of potential on node 62 causes line 26a to rise in potential and, in the presently preferred embodiment, this rise in potential is in the order of magnitude of 1 volt. The sense amplifier and buffer 29 (FIG. 1) utilizes a sense amplifier output very similar to the column amplifier, thus large swings in potential in the relatively high capacitance read bus are not required. Note that since transistors 53 and 31 of FIG. 1 are fabricated simultaneously on the same substrate, their thresholds are substantially the same. Thus, until the potential on line 19a drops, transistor 53 is close to the point at which it will begin to conduct. Thus, the sense amplifier 24 minimizes the potential swing required on the high capacitance column line while providing a relatively large swing at the gate of transistor 57.

If the column which includes lines 19a and 19b of FIG. 2 had not been selected, transistor 60 would not conduct and node 66 would be maintained at $V_{CC}$ less a threshold because of enhancement load 59. Also through transistors 61 and 64 of FIG. 1 the drains of transistors 57 and 58 would be likewise maintained at the $V_{CC}$ potential less a threshold. Thus, the source and drains of the sensing transistors 57 and 58 are maintained at the same potential, effectively de-coupling the unselected column lines from the read bus lines.

Figure 3:
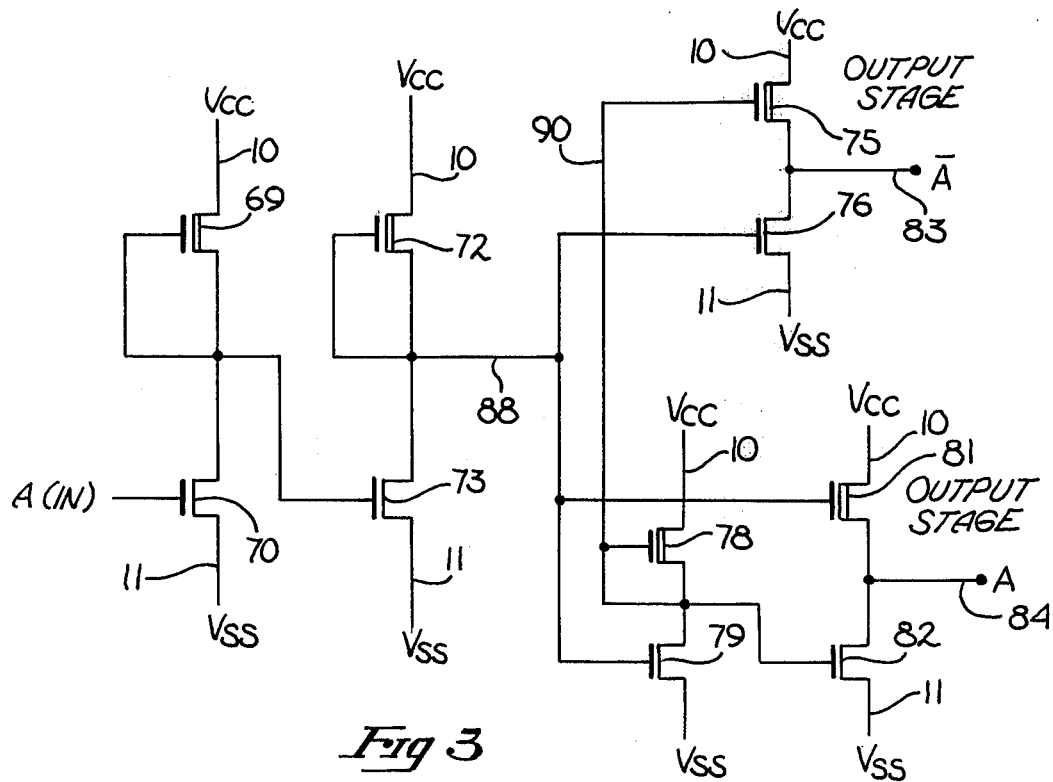
FIG. 3 is a detail circuit diagram of the presently preferred embodiment of an address buffer utilized in the present invention.

In FIG. 3 the address buffer shown is utilized both for those portions or bits of the address coupled to the X-decoder as well as those coupled to the Y-decoders. In the case of the buffers coupled to the Y-decoders, the output stages of the circuit of FIG. 3 include larger devices since the output power required for the Y-decoders is larger than that required for the X-decoders. In the presently preferred embodiment the Y-decoders include both series and parallel decoding transistors, and hence the load on the Y-address buffers is larger.

In FIG. 3 the input stage to the buffer includes an inverter comprising transistors 69 and 70 in series between line 10 and line 11, the input being applied to the gate of transistor 70. Transistor 69 is a depletion load device having its gate coupled to the common junction between transistors 69 and 70, this junction also being common with the gate of transistor 73. The second stage of the buffer, also an inverted stage, comprises transistors 72 and 73 coupled in series between lines 10 and 11. Transistor 72 is a depletion load device and has its gate coupled to the common junction between transistors 72 and 73, node 88. The series combination of transistors 78 and 79 which are coupled between line 10 and line 11 are used for generating a signal opposite in polarity to that appearing on node 88. The common junction between the depletion load transistor 78 and transistor 79, node 90, is coupled to the gates of the output transistor 75 and pull-down transistor 82. Node 88 is common with the gate of transistor 79, the gate of the output transistor 81 and the gate of the pull-down transistor 76. One output stage of the buffer includes depletion load transistor 75 in series with transistor 76. The common junction between these transistors, line 83, provides an output signal which is the complement of the input signal. The other output stage comprises depletion load transistor 81 coupled in series with transistor 82. The common junction between these transistors, line 84, provides an output signal of the same polarity as the input signal to the buffer.

It is apparent that when a positive signal is applied to the gate of transistor 70, the gate of transistor 73 will be brought towards ground potential allowing node 88 to rise to $V_{CC}$ through device 72. The positive potential on node 88 causes transistor 76 to conduct, thus providing a low signal on line 83. The high potential on line 88 provides a corresponding low potential on node 90 through the series transistors 78 and 79. This low potential on node 90 prevents transistor 75 from conducting, and likewise allows line 84 to rise in potential since transistor 82 is not conducting and transistor 81 is conducting.

In the buffer of FIG. 3 the signal on line 83 cannot change without a corresponding change in the signal on line 84 and vice versa. This results from the fact that the gates of transistors 75 and 82 are common as are the gates of transistors 81 and 76. This cross-coupled push-pull buffer eliminates two problems associated with prior art buffers. First, pull-down of the output buffer lines in the prior art has always been faster than the pull-up caused by the output transistors. With the present buffer both rise time and decay time of the output waveforms are substantially equal. Another problem solved by the circuit is that of coincident switching, the cross-coupling of the buffer assures that switching occurs coincidentally.

Thus, a memory system has been disclosed in the form of an MOS static RAM in which fast access times are achieved by limiting voltage swings on high capacitance lines in the memory, and also reliable fast access is assured by preventing multiple selections.

I claim:

1. In an MOS RAM employing at least one column line which is coupled to a memory cell and which communicates with a read line, an improvement comprising:
   a first MOS transistor coupled to said column line for charging said column line to a first potential;
   a second MOS transistor having a first and a second terminal and a gate, said first terminal being coupled to said column line and said gate being coupled to a source of a second potential, the difference between said first and second potential being approximately equal to the threshold voltage of said second transistor; and
   a third MOS transistor for charging said second terminal of said second transistor to said second potential, coupled to said second terminal of said second transistor;
   whereby as the potential on said column line changes said second transistor conducts between said first and second terminals changing the potential on said second terminal of said second transistor, which charged potential may be coupled to a read line.

2. The improvement defined by claim 1 wherein said third MOS transistor comprises a depletion load.

3. The improvement defined in claim 2 wherein said first transistor comprises an enhancement load and wherein said first transistor is coupled to said second potential, said first potential being equal to said second potential less the threshold of said first transistor.

4. The improvement defined in claim 3 including a fourth MOS transistor having a first and second terminal and a gate, said gate being coupled to said second terminal of said second transistor, said first terminal of said fourth transistor being coupled to said read line and said second terminal of said fourth transistor being selectively coupled to a third potential.

5. The improvement defined by claim 4 wherein said second terminal of said fourth transistor is coupled to said third potential through a fifth transistor, said fifth transistor including a gate which is coupled to a decoder so that said fifth transistor conducts when said column is selected.

6. The improvement defined by claim 5 including a pair of enhancement loads, one coupled to said read line and the other coupled to said fifth transistor such that when said column line is unselected, said first and second terminals of said fourth transistor are maintained at the same potential.

7. In a random-access memory employing a plurality of column lines coupled to a read line where said read line is charged from a first potential by an enhancement load, a circuit for coupling each of said column lines to said read line comprising:
   a first transistor having a first and second terminal and a gate, said first terminal being coupled to said read line and said gate being coupled to one of said column lines for sensing a change of potential on said column line;
   switching means for selectively coupling said second terminal of said first transistor to a second potential when said column has been selected, said switching means being coupled to said second terminal of said first transistor;
   a second enhancement load coupled between said first potential and said second terminal of said first transistor;
   whereby when said column line is unselected, said first and second terminals of said first transistor are maintained at approximately the same potential effectively decoupling said column line from said read line.

8. The circuit defined in claim 7 wherein said gate of said first transistor is coupled to said column line through a second transistor, said second transistor including a gate coupled to said first potential and wherein said gate of said first transistor is coupled to said first potential through a depletion load.

9. The circuit defined by claim 8 wherein said first and second transistors, said enhancement loads and said depletion load are n-channel devices.

10. A buffer for a random-access memory which receives an input signal and which generates a complementary pair of output signals comprising:

a first pair of transistors comprising a first transistor and second transistor in series, said input signal being coupled to said second transistor of said first pair;

a second pair of transistors comprising a first transistor and second transistor in series, said second transistor of said second pair being coupled to said input signal and said first transistor of said second pair being coupled to the common junction between said first transistor and second transistor of said first pair; and, a third transistor pair including a first transistor and second transistor in series, said first transistor of said third pair being coupled to said input signal and said second transistor of said third pair being coupled to said common junction between said first and second transistors of said first pair;

whereby said complementary output signals may be sensed at the junctions between said first and second transistors of said second and third pairs.

11. The buffer defined by claim 10 wherein said transistors comprise MOS transistors.

12. The buffer defined in claim 11 wherein said first transistor of said first, second and third transistor pairs comprise depletion mode devices.

13. The buffer defined by claim 12 wherein said transistors are n-channel transistors.

14. The buffer defined by claim 13 including an input stage for receiving and processing said input signal prior to its coupling to said first, second and third transistor pairs.

* * * * *